(12) United States Patent
Boyd et al.

(10) Patent No.: US 11,889,282 B2
(45) Date of Patent: Jan. 30, 2024

(54) MEMS DEVICE

(71) Applicant: AAC ACOUSTIC TECHNOLOGIES (SHENZHEN) CO., LTD., Shenzhen (CN)

(72) Inventors: Euan James Boyd, Eb (GB); Scott Lyall Cargill, Eb (GB); Yannick Pierre Kervran, Hk (FR)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 76 days.

(21) Appl. No.: 17/826,184

(22) Filed: May 27, 2022

(65) Prior Publication Data

US 2023/0388711 A1   Nov. 30, 2023

(51) Int. Cl.
| | |
|---|---|
| *H04R 7/06* | (2006.01) |
| *H04R 7/18* | (2006.01) |
| *B81B 3/00* | (2006.01) |
| *H04R 19/04* | (2006.01) |

(52) U.S. Cl.
CPC .............. *H04R 7/06* (2013.01); *B81B 3/0021* (2013.01); *H04R 7/18* (2013.01); *H04R 19/04* (2013.01); *B81B 2201/0257* (2013.01); *B81B 2203/019* (2013.01); *B81B 2203/0127* (2013.01); *B81B 2203/04* (2013.01); *B81B 2207/07* (2013.01); *H04R 2201/003* (2013.01); *H04R 2410/03* (2013.01)

(58) Field of Classification Search
CPC .......... B81B 3/0021; B81B 2201/0257; B81B 2203/0127; B81B 2203/019; B81B 2203/04; B81B 2207/07; H04R 7/18; H04R 19/04; H04R 2201/003; H04R 2410/03; H04R 7/06–10
See application file for complete search history.

(56) References Cited

U.S. PATENT DOCUMENTS

| | | | |
|---|---|---|---|
| 2015/0276529 A1* | 10/2015 | Wiesbauer | ............ G01L 9/0072 73/724 |
| 2019/0071305 A1* | 3/2019 | Strasser | .................... B81B 7/02 |

* cited by examiner

*Primary Examiner* — Mark Fischer
(74) *Attorney, Agent, or Firm* — W&G Law Group

(57) ABSTRACT

Provided is a MEMS device. The MEMS device includes: substrate having back cavity passing therethrough; diaphragm connected to the substrate and covers the back cavity, the diaphragm comprises first and second membranes, and accommodating space is formed between the first and second membranes; supports arranged in the accommodating space, and opposite ends of the support are connected to the first and second membranes; counter electrode arranged in the accommodating space, the first and second membranes each include conductive and second regions, the second region is formed by semiconductor material without doping conductive ions. Through design of the first and second membranes as the first region and the second region, respectively, the second region is formed by semiconductor material without doping conductive ions, and the first region is formed by doping conductive ions in the semiconductor material, so that the compliance performance is improved and not at risk of delamination.

8 Claims, 4 Drawing Sheets

MEMS DEVICE

TECHNICAL FIELD

The present disclosure relates to the technical field of micro electro mechanical system (MEMS), in particular to a MEMS device.

BACKGROUND

In the related art, a microphone with a double-membrane structure has been developed and produced. The microphone has two membranes on opposite sides of the counter electrode. This creates a sealed accommodating space between the two membranes, which can have different pressures compared to the external environment. If the pressure in the accommodating space is reduced, this structure will significantly reduce self-noise associated with the counter electrode (a main noise source in MEMS microphones).

In the related art, the membrane is made of a conductive polysilicon conductor to act as an electrode, but this will adversely affect sensitivity of the microphone due to stray capacitance between the two membranes.

SUMMARY

The purpose of the present disclosure is to provide a MEMS device to solve the technical problems in the related art.

The present disclosure provides a MEMS device, including: a substrate having a back cavity passing through the substrate; a diaphragm connected to the substrate and covers the back cavity, the diaphragm includes a first membrane and a second membrane arranged opposite to each other, and an accommodating space is formed between the first membrane and the second membrane; a plurality of supports arranged in the accommodating space, and opposite ends of each of the plurality of supports are respectively connected to the first membrane and the second membrane; and a counter electrode arranged in the accommodating space and spaced apart from the first membrane and the second membrane. A plurality of ventilation slots are provided on the diaphragm along a circumferential direction thereof and are annularly spaced from each other, the plurality of ventilation slots successively penetrate through the first membrane, the supports and the second membrane. The first membrane and the second membrane each includes a first region and a second region, the first region extends from a center of the diaphragm toward an edge of the diaphragm and does not extend to the ventilation slots. The first region is an electrode region, and the second region is located at a circumferential outer side of the first region. The second region is formed by a semiconductor material without doping conductive ions, and the first region is formed by doping conductive ions in the semiconductor material.

As an improvement, the MEMS device further includes a bonding pad connected to an external circuit and a conducting track connecting the first region to the bonding pad, the conducting track is arranged avoiding the plurality of ventilation slots.

As an improvement, the first membrane includes a plurality of first protrusions protruding toward the accommodating space, and the second membrane includes a plurality of second protrusions protruding toward the accommodating space, and the plurality of first protrusions and the plurality of second protrusions are connected by the supports.

As an improvement, a plurality of through holes are provided on the electrode region, and the plurality of through holes, the plurality of first protrusions and the plurality of second protrusions are in one-to-one correspondence.

As an improvement, the supports each include a plurality of support members arranged concentrically, and the plurality of support members are spaced along a radial direction of the diaphragm with a center of the diaphragm regarded as the center; and each of the plurality of support members is composed of a plurality of first sections concentrically arranged, the plurality of first sections are arranged at intervals, and a first notch is formed between two adjacent ones of the plurality of first sections.

As an improvement, positions of the first notches in two adjacent one of the plurality of support members are in a one-to-one correspondence, and arc lengths of the first notches increase along the radial direction of the diaphragm.

As an improvement, in at least one of the plurality of support members close to the edge of the diaphragm, the first sections is each composed of a plurality of second sections concentrically arranged, the plurality of second sections are arranged at intervals, and a second notch is formed between two adjacent ones of the plurality of second sections.

As an improvement, the plurality of first sections and the plurality of second sections are each an arc section.

Compared with the related art, the present disclosure configures the first membrane and the second membrane as a first region and a second region, respectively, and the first region avoids the position of the ventilation slots, so that the first region can be positioned in the movement of the diaphragm at a position that can most effectively generate electrical signals, thereby increasing the sensitivity of the microphone. In addition, the second region is formed by a semiconductor material without doping conductive ions, and the first region is formed by doping conductive ions in the semiconductor material, so that the compliance performance is improved and not at risk of delamination.

REFERENCE SIGNS

10—base,
11—back cavity;
20—diaphragm,
21—electrode region,
211—through hole,
22—first membrane,
221—first protrusion,
23—second membrane,
231—second protrusion,
24—accommodating space,
25—ventilation slot, 26—first region,
second region,
30—support,
31—support member,
32—first arc section,
33—first notch,
34—second arc section,
35—second notch,
40—counter electrode,
50—conducting track.

DESCRIPTION OF EMBODIMENTS

Embodiments described below with reference to the drawings are exemplary, and are only used to explain the present disclosure, which shall not be construed as limiting the present disclosure.

Figure 1:
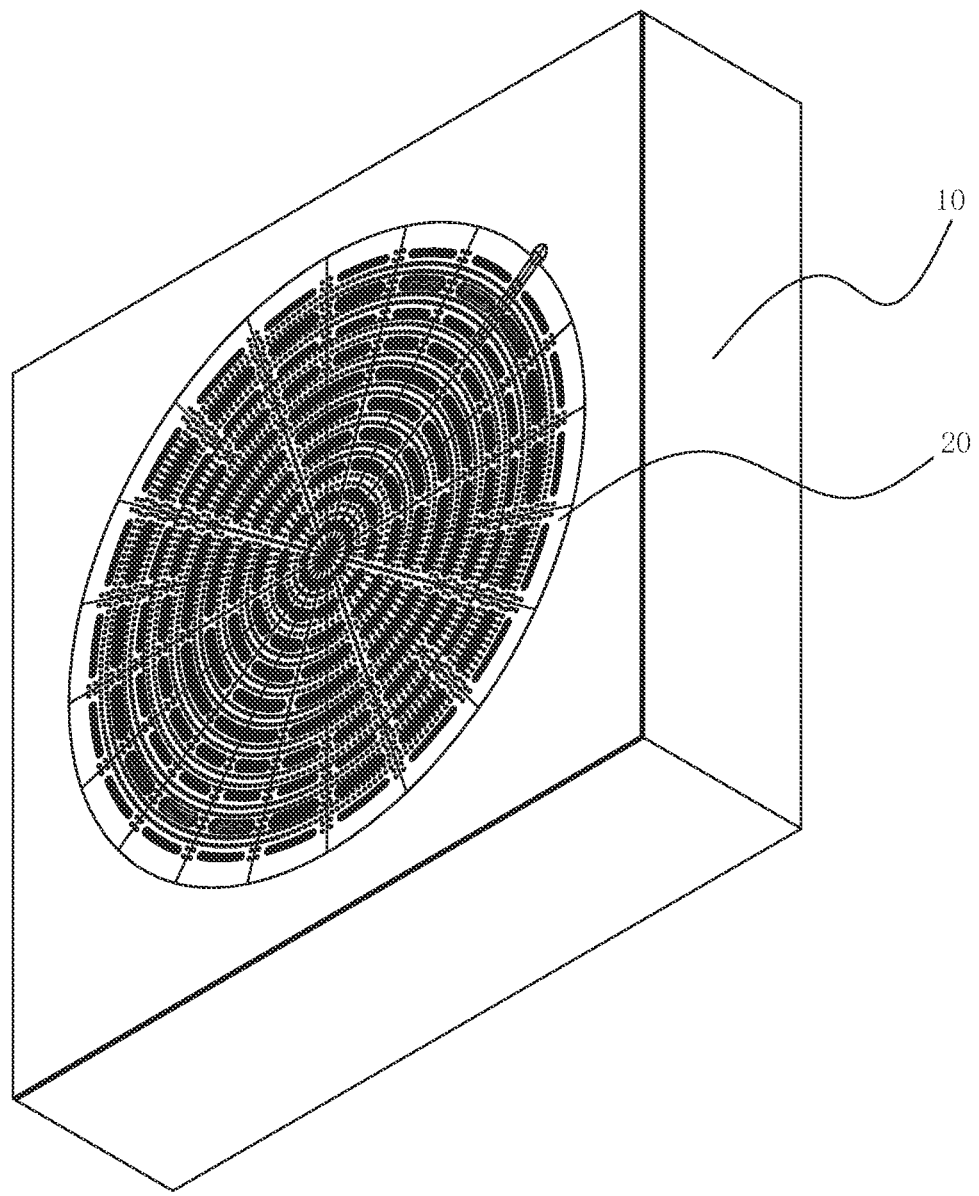
FIG. 1 is an isometric view of an MEMS device according to an embodiment of the present disclosure.
Figure 2:
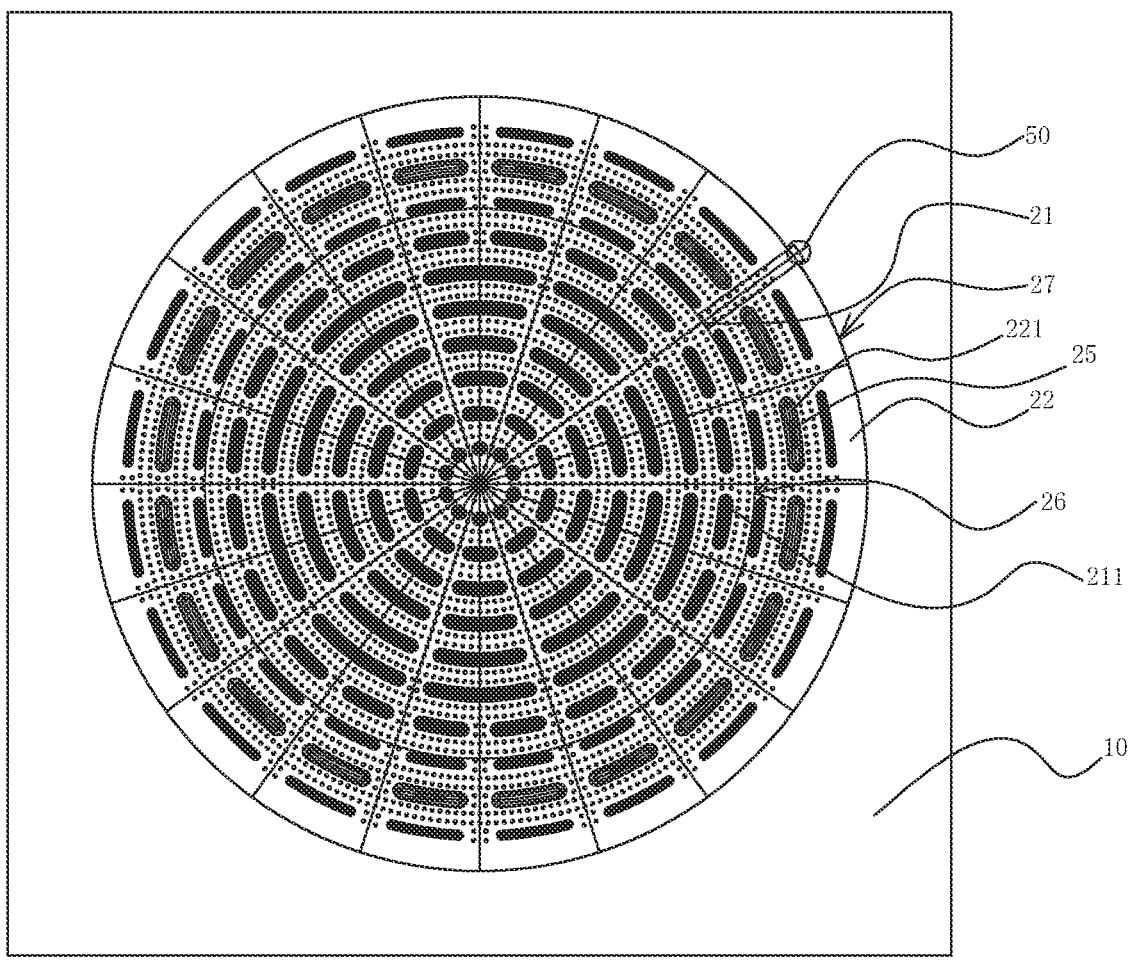
FIG. 2 is a top view of an MEMS device according to an embodiment of the present disclosure.
Figure 3:
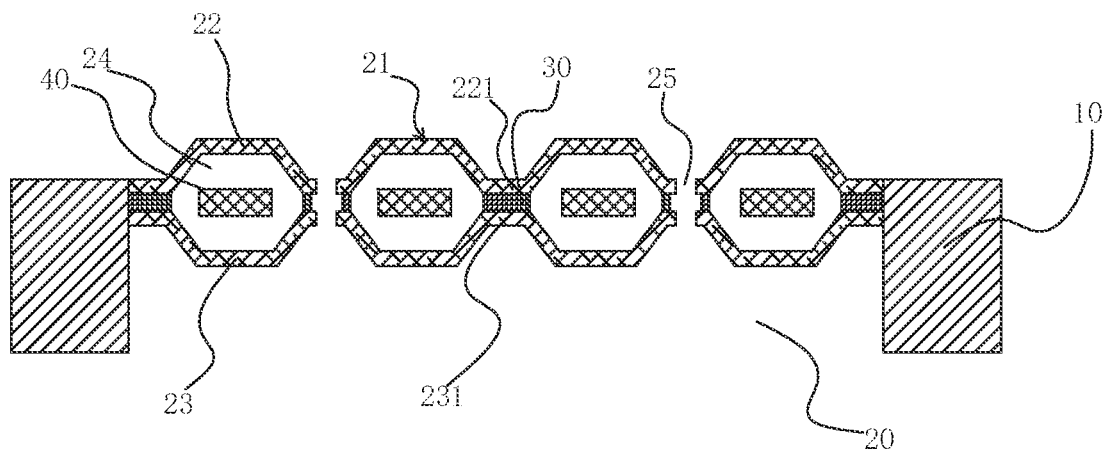
FIG. 3 is a schematic view showing an installation position of an electrode region according to an embodiment of the present disclosure.

As shown in FIGS. 1-3, FIG. 1 is an isometric view of an MEMS device according to an embodiment of the present disclosure; FIG. 2 is a top view of an MEMS device according to an embodiment of the present disclosure; and FIG. 3 is a schematic view showing an installation position of an electrode region according to an embodiment of the present disclosure. An embodiment provides a MEMS device, which includes a substrate 10, a diaphragm 20, a support 30, and a counter electrode 40.

A back cavity 11 passes through the substrate 10. The inner contour surface of the back cavity 11 may be a circular slot structure.

The diaphragm 20 is connected to the substrate 10 and covers the back cavity 11. The diaphragm 20 includes a first membrane 22 and a second membrane 23 that are arranged opposite to each other. In this embodiment, the first membrane 22 and the second membrane 23 are both concentric circular structures. A predetermined gap is maintained between the first membrane 22 and the second membrane 23 to form an accommodating space 24. The first membrane 22 is located in an upper portion as shown in FIG. 1, and the second membrane 23 is located below the first membrane 22.

The support 30 is arranged in the accommodating space 24, and opposite ends of the support 30 are respectively connected to the first membrane 22 and the second membrane 23. The function of the support 30 is to keep the first membrane 22 and the second membrane 23 flat, or at least limit/control the bending/deformation of the first membrane 22 and the second membrane 23 between the supports 30. Therefore, the first diaphragm 22 and the second membrane 23 can be prevented from being folded with each other when the sealed volume of the accommodating space 24 is at a decreased atmospheric pressure and the outside is at an ambient atmospheric pressure.

The counter electrode 40 is arranged in the accommodating space 24 in a suspended state. Generally, there is no contact between the counter electrode 40 and the first membrane 22 and the second membrane 23, and there is no mechanical coupling between the counter electrode 40 and the support member 31. It is appreciated that, in this context, the term "loop member" may refer to any member that forms a loop, for example a circular ring, a rounded square or rectangle or the like. The specific shape is not limited herein. A first capacitor is formed between the first membrane 22 and the counter electrode 40, and a second capacitor is formed between the second membrane 23 and the counter electrode 40. In response to the pressure applied to the first membrane 22 and the second membrane 23, the first membrane 22 and the second membrane 23 are movable relative to the corresponding counter electrode 40, thereby changing the distances between first membrane 22 and the second membrane 23 relative to the corresponding counter electrode 40. As a result, the capacitance is changed to output an electrical signal accordingly.

In the present disclosure, the first membrane 22 and the second membrane 23 both includes a first region 26 and a second region 27. For example, the first region 26 refers to an electrode region 21 on the second region 27. The electrode region 21 refers to the portion inside the solid circle shown in FIG. 2. The second region 27 is formed by a semiconductor material without doping conductive ions, and the first region 26 is formed by doping conductive ions in the semiconductor material, so that the compliance performance is improved and thus is not easily peeled off. The electrode region 21 is connected to a bonding pad by a conducting track 50 and the bonding pad is connected to an external circuit, so that the electrode region 21 can be positioned at a position where the movement of the diaphragm 20 can be most effectively converted into electrical signals, so as to increase the sensitivity of the microphone.

Figure 4:
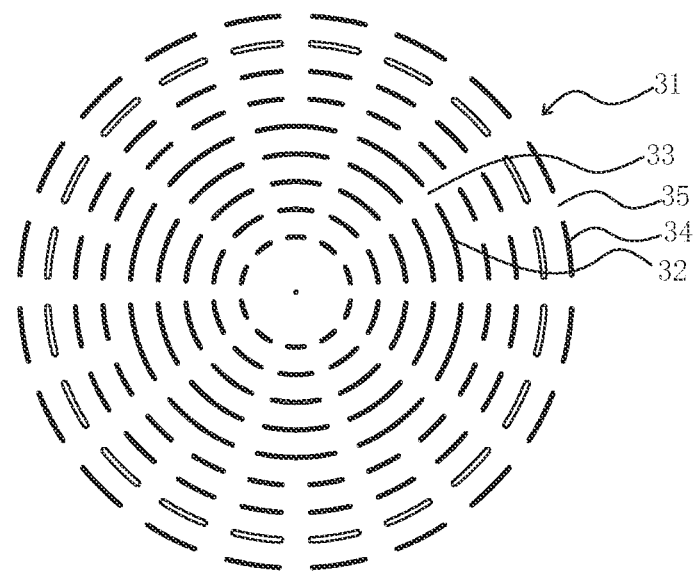
FIG. 4 is a schematic structural view of support members according to an embodiment of the present disclosure.
Figure 5:
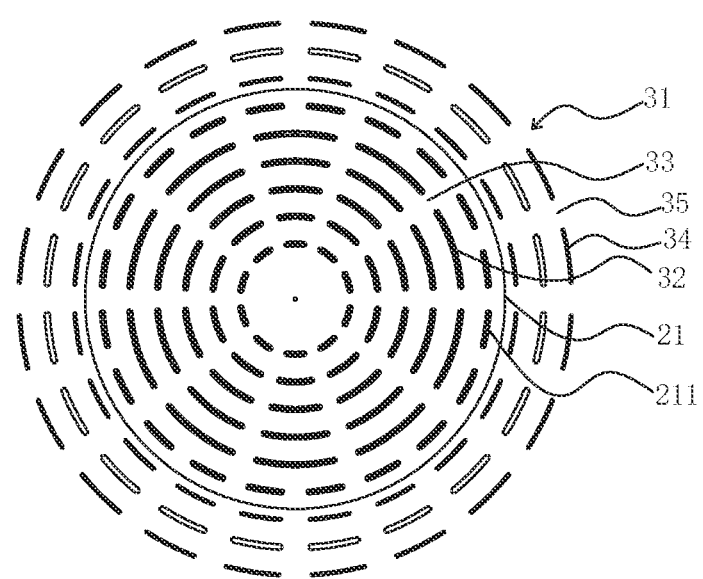
FIG. 5 is a schematic diagram showing cooperation between an electrode region and a support according to an embodiment of the present disclosure.

Referring to FIGS. 4-5, FIG. 4 is a schematic structural diagram of support members according to an embodiment of the present disclosure, and FIG. 5 is a schematic diagram showing cooperation between an electrode region and a support according to an embodiment of the present disclosure. In the present embodiment, the electrode region 21 is also a wafer structure. The electrode region 21 is arranged concentrically in the middle of the diaphragm 20. In this embodiment, the circumference of the diaphragm 20 is connected to the substrate 10. Its deflection presents a parabolic shape being the largest at the center of the diaphragm 20 and decrease to zero at the edge.

In the present embodiment, the first membrane 22 and the second membrane 23 are both provided with a ventilation slot 25. Optionally, the ventilation slot 25 successively penetrates through the first membrane 22, the supports 30 and the second membrane 23. That means a vent is provided between the first membrane 22 and the second membrane 23. Therefore, the compliance of the membrane in the area where the ventilation slot 25 is located can be significantly increased. For example the ventilation slots 25 may only be provided at periphery of the diaphragm 20. Several ventilation slots 25 may be located in the circumferential area of the electrode region 21 at an intervals. The ventilation slots 25 on the first membrane 22 and the second membrane 23 may have the same or different size and shape, which is not limited herein.

Since the sensitivity of the microphone is determined by the ratio of change of the capacitance relative to the pressure, an electrode region 21 is provided on the diaphragm 20 at a position where movement of the diaphragm is most intense, i.e. the middle portion of the diaphragm 20. The electrode region 21 is not provided at the edge of the diaphragm 20. Therefore, the parasitic capacitance between the first membrane 22 and the second membrane 23 can be decreased, and the sensitivity of the microphone can be increased accordingly.

In the present embodiment, as shown in FIG. 3, the diaphragm 20 has a corrugated structure. The first membrane 22 includes a plurality of first protrusions 221 protruding toward the accommodating space 24, and the second membrane 23 includes a plurality of second protrusions 232 protruding toward the accommodating space 24. The electrode region 21 is provided with a plurality of through holes 211. The plurality of through holes 211, the plurality of first protrusions 221 and the plurality of second protrusions 232 are in one-to-one correspondence. The inner contour surface of the through hole 211 is adapted to the outer contour surfaces of the first protrusion 221 and the second protrusion 232.

The support 30 is connected to the first protrusion 221 and the second protrusion 232. The first membrane 22 and the second membrane 23 are close to each other at the support 30, at which position the capacitance is the highest, and the through hole 211 is provided at the position of the electrode region 21 corresponding to the support 30. As a result, the electrode region 21 avoids the areas of the first protrusion 221 and the second protrusion 232.

For example, the shapes and sizes of the first protrusions 221 and the second protrusions 232 are the same to form regular corrugations, so that the stress distribution on the entire diaphragm 20 is uniform, and at the same time, it is advantageous for the forming process. The cross-section of the first protrusion 221 and the second protrusion 232 in the direction perpendicular to the diaphragm 20 may be a regular shape of rectangular, trapezoidal, or triangular, and the angle of the inclined surface of the first protrusion 221 and the second protrusion 232 is greater than 0°, and less than or equal to 90°. Alternatively, the cross-section may be a irregular shape such as a rounded rectangle or a polygon. Those skilled in the art can understand that the cross-section of the first protrusion 221 and the second protrusion 232 in the direction perpendicular to the diaphragm 20 can be either regular or irregular, which is not limited herein.

The first protrusion 221 and the second protrusion 232 together form a corrugation structure of the diaphragm 20, so that the diaphragm 20 can have decreased tensile stress, due to the fact that the corrugated structure allows a decrease of the tensile stress in the diaphragm. In addition, the formed diaphragm 20 has a smaller size. Due to the decreased internal stress, the stiffness of the diaphragm 20 is reduced, which effectively increases the mechanical sensitivity of the MEMS device.

Referring to FIG. 4, the support 30 includes a support member 31 arranged concentrically, and a plurality of support members 31 are arranged at intervals along the radial direction of the diaphragm 20 with the center of the diaphragm 20 as the center.

The support member 31 may be an integral wall-shaped structure, or it may be provided with a cavity, and the cavity may be filled with a filling material. The filling material may be an oxide, such as silicon oxide or the like. Alternatively, the cavity may be empty. Slots can also be provided in the cavity to allow air from the external environment or etching solution to enter the cavity to release the filling material, thereby increasing the compliance of the first membrane 22 and the second membrane 23, and reducing the inter-plate capacitance between the first membrane 22 and the second membrane 23.

The support member 31 may be integrally formed with one of the first membrane 22 and the second membrane 23. Alternatively, after the first membrane 22 and the second membrane 23 are assembled together, a support member 31 is formed therebetween.

In the present embodiment, each support member 31 is composed of a plurality of concentrically arranged first arc sections 32. The counter electrode 40 is provided with a via hole corresponding to the first arc section 32 for the support member 31. The cross-section of the first arc section 32 may be an arc structure, the inner diameters of the plurality of first arc sections 32 in the same support member 31 are all the same, and the plurality of first arc sections 32 are arranged at intervals. A first notch 33 is formed between two adjacent first arc sections 32, and the larger first arc section 32 is used to support the first membrane 22 and the second membrane 23, so that the adjacent first arc sections 32 have larger spacing therebetween, so as to solve the problem that the counter electrode 40 requires a large amount of via holes. The design of the counter electrode 40 and the design of the support member 31 are separately achieved. A first arc section 32 is much larger than the small pillars of the related art, which makes the pillar structure having the same aspect ratio become much taller. Therefore, it is possible to use a thicker counter electrode 40, and allow for a more stiff structure, which can significantly improve the stability and reliability of the device.

In addition, for at least one support member 31, the first arc section 32 is formed by the concentrically disposed second arc sections 34. Each second arc section 34 cross-section has the same arc shape. In the same first arc section 32, the inner diameters of the second arc sections 34 are all the same. The second arc sections 34 are arranged at intervals, and a second notch 35 is formed between two adjacent second arc sections 34. There is no need to provide a via hole at the second notch 35, thereby increasing the rigidity of the counter electrode 40.

In the present embodiment, for the four support members 31 close to the edge of the diaphragm 20, the first arc section 32 consists of two concentrically arranged second arc sections 34. A second notch 35 is formed between the two arc second sections 34, and the second notch 35 is located in the middle of the first arc section 32. Those skilled in the art can understand that, the number and position of the second arc sections 34 included in a first arc section 32 may vary according to the actual situation, which is not limited herein.

With reference to FIG. 4, the first notches 33 in the two adjacent support members 31 are in one-to-one correspondence. Along the radial direction of the diaphragm 20, the arc lengths of first notches 33 in the support members 31 gradually increase. Since there is no need to provide a via hole at the position corresponding to the first notch 33, the rigidity of the counter electrode 40 can be further increased.

The structure, features, and effects according to the present disclosure are described in detail above based on the embodiments shown in the drawings. The above are only preferred embodiments of the present disclosure. However, the above embodiment do not limit the scope of the present disclosure. Any changes or equivalent embodiments which still do not exceed the concept covered by the specification and illustrations should fall within the protection scope of the present disclosure.

What is claimed is:

1. A micro electro mechanical system (MEMS) device, comprising:
   a substrate having a back cavity passing through the substrate;
   a diaphragm connected to the substrate and covers the back cavity, wherein the diaphragm comprises a first membrane and a second membrane arranged opposite to each other, and an accommodating space is formed between the first membrane and the second membrane;
   a plurality of supports arranged in the accommodating space, and opposite ends of each of the plurality of supports are respectively connected to the first membrane and the second membrane; and
   a counter electrode arranged in the accommodating space and spaced apart from the first membrane and the second membrane,
   wherein a plurality of ventilation slots are provided on the diaphragm along a circumferential direction thereof and are annularly spaced from each other, the plurality of ventilation slots successively penetrate through the first membrane, the supports and the second membrane, the first membrane and the second membrane each comprises a first region and a second region, the first region extends from a center of the diaphragm toward an edge of the diaphragm and does not extend to the ventilation slots, the first region is an electrode region, the second region is located at a circumferential outer side of the first region, and the second region is formed by a semiconductor material without doping conductive ions, and the first region is formed by doping conductive ions in the semiconductor material.

2. The MEMS device according to claim 1, further comprising a bonding pad connected to an external circuit and a conducting track connecting the first region to the bonding pad, wherein the conducting track is arranged avoiding the plurality of ventilation slots.

3. The MEMS device according to claim 1, wherein the first membrane comprises a plurality of first protrusions protruding toward the accommodating space, and the second membrane includes a plurality of second protrusions protruding toward the accommodating space, and the plurality of first protrusions and the plurality of second protrusions are connected by the supports.

4. The MEMS device according to claim 3, wherein a plurality of through holes are provided on the electrode region, and the plurality of through holes, the plurality of first protrusions and the plurality of second protrusions are in one-to-one correspondence.

5. The MEMS device according to claim 4, wherein in at least one of the plurality of support members close to the edge of the diaphragm, the first sections is each composed of a plurality of second sections concentrically arranged, the plurality of second sections are arranged at intervals, and a second notch is formed between two adjacent ones of the plurality of second sections.

6. The MEMS device according to claim 5, wherein the plurality of first sections and the plurality of second sections are each an arc section.

7. The MEMS device according to claim 1, wherein the supports each comprise a plurality of support members arranged concentrically, and the plurality of support members are spaced along a radial direction of the diaphragm with a center of the diaphragm regarded as the center; and each of the plurality of support members is composed of a plurality of first sections concentrically arranged, the plurality of first sections are arranged at intervals, and a first notch is formed between two adjacent ones of the plurality of first sections.

8. The MEMS device according to claim 7, wherein positions of the first notches in two adjacent one of the plurality of support members are in a one-to-one correspondence, and arc lengths of the first notches increase along the radial direction of the diaphragm.

* * * * *